United States Patent
Hautala et al.

(10) Patent No.: US 6,410,432 B1
(45) Date of Patent: Jun. 25, 2002

(54) CVD OF INTEGRATED TA AND TAN$_x$ FILMS FROM TANTALUM HALIDE PRECURSORS

(75) Inventors: John J. Hautala, Beverly; Johannes F. M. Westendorp, Rockport, both of MA (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 09/300,632

(22) Filed: Apr. 27, 1999

(51) Int. Cl.⁷ .............................................. C23C 16/08
(52) U.S. Cl. .................. 438/680; 438/685; 427/576; 427/124; 427/126.3; 427/253; 427/255.39; 427/255.394; 427/255.7
(58) Field of Search .................. 427/576, 124, 427/126.3, 253, 255.39, 255.394, 255.7; 438/680, 685

(56) References Cited

U.S. PATENT DOCUMENTS

| | | | |
|---|---|---|---|
| 2,604,395 A | * 7/1952 | Gonser et al. | |
| 4,535,000 A | 8/1985 | Gordon | 427/160 |
| 4,678,769 A | 7/1987 | King | 502/231 |
| 4,859,617 A | 8/1989 | Nomoto et al. | 437/40 |
| 4,882,224 A | 11/1989 | Moro et al. | 428/403 |
| 4,884,123 A | 11/1989 | Dixit et al. | 357/71 |
| 5,017,403 A | 5/1991 | Pang et al. | 427/39 |
| 5,173,327 A | 12/1992 | Sandhu et al. | 427/573 |
| 5,177,589 A | 1/1993 | Kobayashi et al. | 257/773 |
| 5,271,963 A | 12/1993 | Eichman et al. | 427/248.1 |
| 5,326,404 A | 7/1994 | Sato | 118/723 |
| 5,380,678 A | 1/1995 | Yu et al. | 437/190 |
| 5,466,971 A | 11/1995 | Higuchi | 257/751 |
| 5,565,247 A | * 10/1996 | Suzuki | |
| 5,919,531 A | * 7/1999 | Arkles et al. | |
| 6,139,922 A | 10/2000 | Kaloyoros et al. | 427/576 |
| 6,143,657 A | * 11/2000 | Liu et al. | |
| 6,197,683 B1 | * 3/2001 | Kang et al. | |

FOREIGN PATENT DOCUMENTS

| | | |
|---|---|---|
| EP | 0 875 924 | 11/1998 |
| JP | 01074720 | * 3/1989 |
| JP | 3-209869 | 9/1991 |
| WO | WO 96/12048 | 4/1996 |

OTHER PUBLICATIONS

Hieber et al., Thin Solid Films, vol. 24, pp. 157–164, 1974 (no month).*
Kaloyeros et al., Journal of the Electrochemical Society, vol. 146, No. 1, p. 170–176, 1999 (no month).*
Chen et al., J. Vac. Sci. Technol. B, vol. 16, No. 5, Sep./Oct., 1998, pp 2887–2890.*
Takahashi et al., Journal of the Less–Common Metals, 52, 1977, pp 29–36 (no month).*
Bunshah, Deposition Technologies for Films and Coatings, Noyes Publications, Park Ridge, New Jersey, USA, (1982), pp. 365–366 (no month).*
Pierson, Handbook of Chemical Vapor Deposition (1992), p. 145 (no month available).*

(List continued on next page.)

*Primary Examiner*—Timothy Meeks
(74) *Attorney, Agent, or Firm*—Wood, Herron & Evans, LLP (57) ABSTRACT

A chemical vapor deposition (CVD) method for depositing high quality conformal tantalum/tantalum nitride (Ta/TaN$_x$) bilayer films from inorganic tantalum pentahalide (TaX$_5$) precursors and nitrogen is described. The inorganic tantalum halide precursors are tantalum pentafluoride (TaF$_5$), tantalum pentachloride (TaCl$_5$) and tantalum pentabromide (TaBr$_5$). A TaX$_5$ vapor is delivered into a heated reaction chamber. The vapor is combined with a process gas to deposit a Ta film and a process gas containing nitrogen to deposit a TaN$_x$ film on a substrate that is heated to 300° C.–500° C. The deposited Ta/TaN$_x$ bilayer film is useful for integrated circuits containing copper films, especially in small high aspect ratio features. The high conformality of these films is superior to films deposited by PVD.

20 Claims, 6 Drawing Sheets

OTHER PUBLICATIONS

Funakubo et al., Preparation of TaNx–TiN Films by CVD, J. Ceramic Soc. Jpn. Int. Ed. vol. 98 (173–178) (1990) (no month).

Chen et al., Low Temperature Plasma–Assisted Chemical Vapor Deposition of Tantalum Nitride from Tantalum Pentabromide for Copper Metallization, J. Vac. Sci. Technol. B 17(1), Jan./Feb. 1999 pp 182–185.

* cited by examiner

CVD OF INTEGRATED TA AND TAN$_x$ FILMS FROM TANTALUM HALIDE PRECURSORS

FIELD OF THE INVENTION

The invention relates to the formation of integrated circuits, and specifically to chemical vapor deposition of integrated tantalum and tantalum nitride films deposited from tantalum halide precursors.

BACKGROUND

Integrated circuits (IC) provide the pathways for signal transport in an electrical device. An IC in a device is composed of a number of active transistors contained in a silicon base layer of a semiconductor substrate. To increase the capacity of an IC, large numbers of interconnections with metal "wires" are made between one active transistor in the silicon base of the substrate and another active transistor in the silicon base of the substrate. The interconnections, collectively known as the metal interconnection of a circuit, are made through holes, vias or trenches that are cut into a substrate. The particular point of the metal interconnection which actually makes contact with the silicon base is known as the contact. The remainder of the hole, via or trench is filled with a conductive material, termed a contact plug. As transistor densities continue to increase, forming higher level integrated circuits, the diameter of the contact plug must decrease to allow for the increased number of interconnections, multilevel metalization structures and higher aspect ratio vias.

Aluminum has been the accepted standard for contacts and interconnections in integrated circuits. However, problems with its electromigration and its high electrical resistivity require new materials for newer structures with submicron dimensions. Copper holds promise as the interconnect material for the next generation of integrated circuits in ultra large scale integration (ULSI) circuitry, yet its formation of copper silicide (Cu—Si) compounds at low temperatures and its electromigration through a silicon oxide ($SiO_2$) are disadvantages to its use.

As the shift from aluminum to copper as an interconnect element of choice occurs, new materials are required to serve as a barrier, preventing copper diffusion into the underlying dielectric layers of the substrate and to form an effective "glue" layer for subsequent copper deposition. New materials are also required to serve as a liner, adhering subsequently deposited copper to the substrate. The liner must also provide a low electrical resistance interface between copper and the barrier material. Barrier layers that were previously used with aluminum, such as titanium (Ti) and titanium nitride (TiN) barrier layers deposited either by physical vapor deposition (PVD) methods such as sputtering and/or chemical vapor deposition (CVD), are ineffective as barriers to copper. In addition, Ti reacts with copper to form copper titanium (Cu—Ti) compounds at the relatively low temperatures used with PVD and/or CVD.

Sputtered tantalum (Ta) and reactive sputtered tantalum nitride (TaN) have been demonstrated to be good diffusion barriers between copper and a silicon substrate due to their high conductivity, high thermal stability and resistance to diffusion of foreign atoms. However, the deposited Ta and/or TaN film has inherently poor step coverage due to its shadowing effects. Thus the sputtering process is limited to relatively large feature sizes (>0.3 $\mu$m) and small aspect ratio contact vias. CVD offers the inherent advantage over PVD of better conformality, even in small structures (<0.25 $\mu$m) with high aspect ratios. However, CVD of Ta and TaN with metal-organic sources such as tertbutylimidotris(diethylamido) tantalum (TBTDET), pentakis(dimethylamino)tantalum (PDMAT) and pentakis(diethylamino) tantalum (PDEAT) yields mixed results. Additional problems with Ta and TaN are that all resulting films have relatively high concentrations of oxygen and carbon impurities and require the use of a carrier gas.

The need to use a carrier gas presents the disadvantage that the concentration of the precursor gas in the carrier is not precisely known. As a result, accurate metering of a mixture of a carrier gas and a precursor gas to the CVD reaction chamber does not insure accurate metering of the precursor gas alone to the reactor. This can cause the reactants in the CVD chamber to be either too rich or too lean. The use of a carrier gas also presents the disadvantage that particulates are frequently picked up by the flowing carrier gas and delivered as contaminants to the CVD reaction chamber. Particulates on the surface of a semiconductor wafer during processing can result in the production of defective semiconductor devices.

Thus, a process to deposit Ta/TaN integrated bilayers at low temperatures (<500° C.) implementing an inorganic source of tantalum, such as tantalum pentahalide, would provide an advantage in the formation of copper barriers in the next generation of IC. Ideally, the deposited film will have a high step coverage (the ratio of the coating thickness at the bottom of a feature to the thickness on the sides of a feature or on the top surface of the substrate or wafer adjacent the feature), good diffusion barrier properties, minimal impurities, low resistivity, good conformality (even coverage of complex topography of high aspect ratio features) and ideally the process will have a high deposition rate.

SUMMARY OF THE INVENTION

The invention is directed to a method of providing an integrated tantalum (Ta)/tantalum nitride (TaN$_x$) film from a tantalum halide precursor on a substrate by chemical vapor deposition. The tantalum halide precursor is delivered at a temperature sufficient to vaporize the precursor to provide a vaporization pressure to deliver the tantalum vapor to a reaction chamber containing the substrate. The vaporization pressure is greater than about 3 Torr. Ta is combined with a process gas and is deposited on the substrate by a plasma enhanced CVD (PECVD) process at a pressure in the range of 0.2–5.0 Torr. The vapor is then combined with a process gas containing nitrogen and TaN$_x$ is deposited by either a PECVD or thermal CVD method. Both the Ta and TaN$_x$ layers are deposited in the same chamber, thus increasing the efficiency of the method. The tantalum halide precursor is tantalum fluoride (TaF), tantalum chloride (TaCl) or tantalum bromide (TaBr), preferably tantalum pentafluoride (TaF$_5$), tantalum pentachloride (TaCl$_5$) or tantalum pentabromide (TaBr$_5$). The substrate temperature is in the range of about 300° C.–500° C.

The invention is also directed to a method of depositing an integrated Ta/TaN$_x$ film from a TaF$_5$ or TaCl$_5$ precursor on a substrate by elevating the precursor temperature sufficient to vaporize the precursor. The vapor is combined with a process gas and a Ta film is deposited by PECVD. The vapor is then combined with a process gas containing nitrogen and the TaN$_x$ film is deposited by PECVD or thermal CVD.

The invention is further directed to method of depositing a Ta/TaN$_x$ integrated film from a TaBr$_5$ precursor on a substrate without a carrier gas. The temperature of the precursor is elevated sufficient to produce a tantalum vapor. The vapor is combined with a process gas and Ta is deposited by PECVD then the vapor is combined with a process gas containing nitrogen and the TaN$_x$ film is deposited on the substrate by PECVD or thermal CVD.

The invention is still further directed to a substrate integral with a copper (Cu) layer and an integrated Ta/TaN$_x$ layer in which diffusion of copper is prevented by the integrated Ta/TaN$_x$ layer.

The integrated Ta/TaN$_x$ film deposited according to the invention has minimal impurities and low resistivity. The film provides good step coverage, good conformality even in small high aspect ratio features and is a good diffusion barrier to a copper film.

It will be appreciated that the disclosed method and substrates of the invention have an array of applications. These and other advantages will be further understood with reference to the following drawings and detailed description.

DETAILED DESCRIPTION

Refractory transition metals such as tantalum (Ta) and their nitride films (TaN) are effective diffusion barriers to copper (Cu). Their effectiveness is due to their high thermal stability, high conductivity and resistance to diffusion of foreign elements or impurities. Ta and TaN are especially attractive due to their chemical inertness with Cu; no compounds form between Cu and Ta or Cu and N.

Tantalum halides provide a convenient inorganic source for Ta and TaN. Specifically, the inorganic precursor is a tantalum pentahalide (TaX$_5$) where X represents the halides fluorine (F), chlorine (Cl) and bromine (Br). Table 1 shows relevant thermodynamic properties of the tantalum halide precursors, specifically tantalum pentafluoride (TaF$_5$), tantalum pentachloride (TaCl$_5$) and tantalum bromide (TaBr$_5$), with tantalum pentaiodide (TaI$_5$) included for comparison. The TaF$_5$, TaCl$_5$ and TaBr$_5$ precursor materials are all solids at room temperature (18° C.–22° C.).

TABLE 1

| PRECURSOR | MELTING POINT | BOILING POINT | CHANGE IN HEAT OF FORMATION (ΔHf) |
|---|---|---|---|
| TaF$_5$ | 97° C. | 230° C. | −455 kcal/mole |
| TaCl$_5$ | 216° C. | 242° C. | −205 kcal/mole |
| TaBr$_5$ | 265° C. | 349° C. | −143 kcal/mole |
| TaI$_5$ | 367° C. | 397° C. | −82 kcal/mole |

Figure 1:
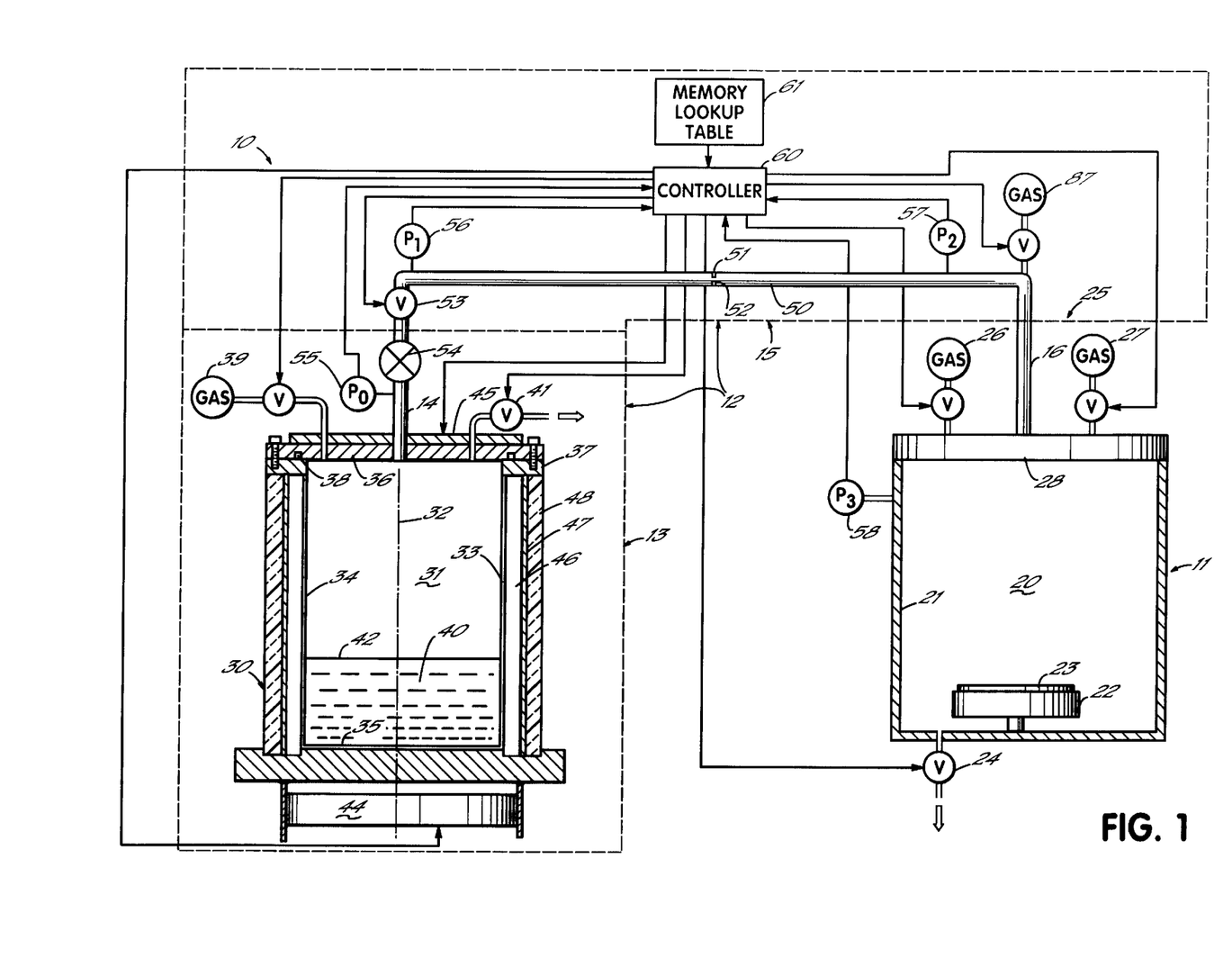
FIG. 1 is a schematic of an apparatus for plasma enhanced chemical vapor deposition (PECVD).

In chemical vapor deposition (CVD) processes, gas precursors are activated using either thermal energy or electrical energy. Upon activation, the gas precursors react chemically to form a film. A preferred method of CVD is illustrated in FIG. 1 and is disclosed in copending application Ser. No. 09/300,669, now abandoned, entitled APPA-RATUS AND METHODS FOR DELIVERY OF VAPOR FROM SOLID SOURCES TO A CVD CHAMBER by Westendorp et al. filed on the same date as the present application and assigned to Tokyo Electron Limited and incorporated by reference herein in its entirety. A chemical vapor deposition (CVD) system 10 includes a CVD reaction chamber 11 and a precursor delivery system 12. In the reaction chamber 11, a reaction is carried out to convert a precursor gas of, for example, tantalum chloride (TaCl) or other tantalum halide compound, into a film such as a barrier layer film of tantalum (Ta) and/or tantalum nitride (TaN$_x$) The TaN film is not limited to any particular stoichiometry (TaN$_x$), since TaN can be continuously varied by changing the ratios of the gases in any given deposition. Thus, as used herein, TaN$_x$ encompasses a tantalum nitride film of any stoichiometry.

The precursor delivery system 12 includes a source 13 of precursor gas having a gas outlet 14, which communicates through a metering system 15 with a gas inlet 16 to the CVD reaction chamber 11. The source 13 generates a precursor vapor, for example a tantalum halide vapor, from a tantalum halide compound. The compound is one that is in a solid state when at standard temperature and pressure. The precursor source is maintained, preferably by controlled heating, at a temperature that will produce a desired vapor pressure of precursor. Preferably, the vapor pressure is one that is itself sufficient to deliver the precursor vapor to the reaction chamber 11, preferably without the use of a carrier gas. The metering system 15 maintains a flow of the precursor gas vapor from the source 13 into the reaction chamber 11 at a rate that is sufficient to maintain a commercially viable CVD process in the reaction chamber 11.

The reaction chamber 11 is a generally conventional CVD reactor and includes a vacuum chamber 20 that is bounded by a vacuum tight chamber wall 21. In the chamber 20 is situated a substrate support or susceptor 22 on which a substrate such as a semiconductor wafer 23 is supported. The chamber 20 is maintained at a vacuum appropriate for the performance of a CVD reaction that will deposit a film such as a Ta/TaN$_x$ barrier layer on the semiconductor wafer substrate 23. A preferred pressure range for the CVD reaction chamber 11 is in the range of from 0.2–5.0 Torr. The vacuum is maintained by controlled operation of a vacuum pump 24 and of inlet gas sources 25 that include the delivery system 12 and may also include reducing gas sources 26 of, for example, hydrogen (H$_2$), nitrogen (N$_2$) or ammonia (NH$_3$) for use in carrying out a tantalum reduction reaction, and an inert gas source 27 for a gas such as argon (Ar) or helium (He). The gases from the sources 25 enter the chamber 20 through a showerhead 28 that is situated at one end of the chamber 20 opposite the substrate 23, generally parallel to and facing the substrate 23.

The precursor gas source 13 includes a sealed evaporator 30 that includes a cylindrical evaporation vessel 31 having a vertically oriented axis 32. The vessel 31 is bounded by a cylindrical wall 33 formed of a high temperature tolerant and non-corrosive material such as the alloy INCONEL 600, the inside surface 34 of which is highly polished and smooth. The wall 33 has a flat circular closed bottom 35 and an open top, which is sealed by a cover 36 of the same heat tolerant and non-corrosive material as the wall 33. The outlet 14 of the source 13 is situated in the cover 36. When high temperatures are used, such as with TiI$_4$ or TaBr$_5$, the cover 36 is sealed to a flange ring 37 that is integral to the top of the wall 33 by a high temperature tolerant vacuum compatible metal seal 38 such as a HELICOFLEX seal, which is formed of a C-shaped nickel tube surrounding an INCONEL coil spring. With materials requiring lower temperatures, such as TaCl$_5$ and TaF$_5$, a conventional elastomeric O-ring seal 38 may be used,to seal the cover.

Connected to the vessel 31 through the cover 36 is a source 39 of a carrier gas, which is preferably an inert gas such as He or Ar. The source 13 includes a mass of precursor material such as tantalum fluoride, chloride or bromide (TaX), preferably as the pentahalide (TaX$_5$), at the bottom of the vessel 31, which is loaded into the vessel 31 at standard temperature and pressure in a solid state. The vessel 31 is filled with tantalum halide vapor by sealing the chamber with the solid mass of TaX therein. The halide is supplied as a precursor mass 40 that is placed at the bottom of the vessel 31, where it is heated, preferably to a liquid state as long as the resulting vapor pressure is in an acceptable range. Purge gas and TaX vapors are, however, first evacuated from the vessel 31 with a vacuum pump 41. Where the mass 40 is liquid, the vapor lies above the level of the liquid mass 40. Because wall 33 is a vertical cylinder, the surface area of TaX mass 40, if a liquid, remains constant regardless of the level of depletion of the TaX.

The delivery system 12 is not limited to direct delivery of a precursor 40 but can be used in the alternative for delivery of precursor 40 along with a carrier gas, which can be introduced into the vessel 31 from gas source 39. Such a gas may be hydrogen (H$_2$) or an inert gas such as helium (He) or argon (Ar). Where a carrier gas is used, it may be introduced into the vessel 31 so as to distribute across the top surface of the precursor mass 40 or may be introduced into the vessel 31 so as to percolate through the mass 40 from the bottom 35 of the vessel 31 with upward diffusion in order to achieve maximum surface area exposure of the mass 40 to the carrier gas. Yet another alternative is to vaporize a liquid that is in the vessel 31. However, such alternatives add undesired particulates and do not provide the controlled delivery rate achieved by the direct delivery of the precursor, that is, delivery without the use of a carrier gas. Therefore, direct delivery of the precursor is preferred.

Figure 2:
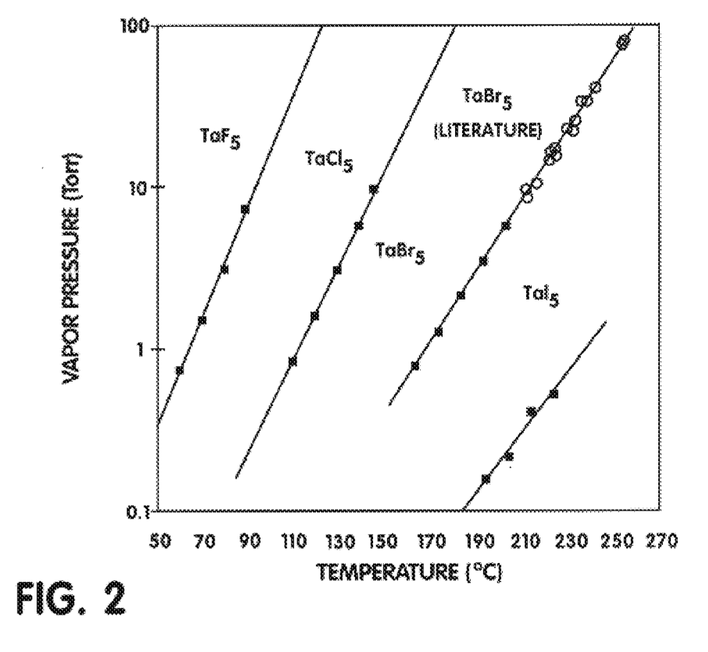
FIG. 2 is a graph of vapor pressure versus temperature for tantalum halides.

To maintain the temperature of the precursor 40 in the vessel 31, the bottom 35 of the wall 33 is maintained in thermal communication with a heater 44, which maintains the precursor 40 at a controlled temperature, preferably above its melting point, that will produce a vapor pressure of greater than about 3 Torr in the absence of a carrier gas (i.e., a direct delivery system), and a lower vapor pressure such as about 1 Torr when a carrier gas is used. The exact vapor pressure depends upon other variables such as the quantity of carrier gas, the surface area of the substrate 23, and so on. In a direct delivery system for tantalum, a vapor pressure can be maintained at the preferred pressure of 5 Torr or above by heating the tantalum halide precursor in the 95° C. to 205° C. range as shown in FIG. 2. For TaX$_5$ the desired temperature is at least about 95° C. for TaF$_5$, the desired temperature is at least about 145° C. for TaCl$_5$, and the desired temperature is at least about 205° C. for TaBr$_5$. The melting points of the respective fluoride, chloride and bromide tantalum pentahalide compounds are in the 97° C. to 265° C. range. A much higher temperature is required for tantalum pentaiodide (TaI$_5$) to produce a sufficient vapor pressure in the vessel 31. Temperatures should not be so high as to cause premature reaction of the gases in the showerhead 28 or otherwise before contacting the wafer 23.

For purposes of example, a temperature of 180° C. is assumed to be the control temperature for the heating of the bottom 35 of the vessel 31. This temperature is appropriate for producing a desired vapor pressure with a titanium tetraiodide (TiI$_4$) precursor. Given this temperature at the bottom 35 of the vessel 31, to prevent condensation of the precursor vapor on the walls 33 and cover 36 of the vessel 31, the cover is maintained at a higher temperature than the heater 44 at the bottom 35 of the wall 33 of, for example, 190° C., by a separately controlled heater 45 that is in thermal contact with the outside of the cover 36. The sides of the vessel wall 33 are surrounded by an annular trapped air space 46, which is contained between the vessel wall 33 and a surrounding concentric outer aluminum wall or can 47. The can 47 is further surrounded by an annular layer of silicon foam insulation 48. This temperature maintaining arrangement maintains the vapor in a volume of the vessel 31 bounded by the cover 36, the sides of the walls 33 and the surface 42 of the precursor mass 40 in the desired example temperature range of between 180° C. and 190° C. and the pressure greater than about 3 Torr, preferably at greater than 5 Torr. The temperature that is appropriate to maintain the desired pressure will vary with the precursor material, which is primarily contemplated as a being a tantalum or titanium halide compound.

The vapor flow metering system 15 includes a delivery tube 50 of at least ½ inch in diameter, or at least 10 millimeters inside diameter, and preferably larger so as to provide no appreciable pressure drop at the flow rate desired, which is at least approximately 2 to 40 standard cubic centimeters per minute (sccm). The tube 50 extends from the precursor gas source 13 to which it connects at its upstream end to the outlet 14, to the reaction chamber 11 to which it connects at its downstream end to the inlet 16. The entire length of the tube 50 from the evaporator outlet 14 to the reactor inlet 16 and the showerhead 28 of the reaction chamber 11 are also preferably heated to above the evaporation temperature of the precursor material 40, for example, to 195° C.

In the tube 50 is provided baffle plate 51 in which is centered a circular orifice 52, which preferably has a diameter of approximately 0.089 inches. The pressure drop from gauge 1 56 to gauge 2 57 is regulated by control valve 53. This pressure drop after control valve 53 through orifice 52 and into reaction chamber 11 is greater than about 10 milliTorr and will be proportional to the flow rate. A shut-off valve 54 is provided in the line 50 between the outlet 14 of the evaporator 13 and the control valve 53 to close the vessel 31 of the evaporator 13.

Pressure sensors 55–58 are provided in the system 10 to provide information to a controller 60 for use in controlling the system 10, including controlling the flow rate of precursor gas from the delivery system 15 into the chamber 20 of the CVD reaction chamber 11. The pressure sensors include sensor 55 connected to the tube 50 between the outlet 14 of the evaporator 13 and the shut-off valve 54 to monitor the pressure in the evaporation vessel 31. A pressure sensor 56 is connected to the tube 50 between the control valve 53 and the baffle 51 to monitor the pressure upstream of the orifice 52, while a pressure sensor 57 is connected to the tube 50 between the baffle 51 and the reactor inlet 16 to monitor the pressure downstream of the orifice 52. A further pressure sensor 58 is connected to the chamber 20 of the reaction chamber 11 to monitor the pressure in the CVD chamber 20.

Control of the flow of precursor vapor into the CVD chamber 20 of the reaction chamber 11 is achieved by the controller 60 in response to the pressures sensed by the sensors 55–58, particularly the sensors 56 and 57 which determine the pressure drop across the orifice 52. When the conditions are such that the flow of precursor vapor through the orifice 52 is unchoked flow, the actual flow of precursor vapor through the tube 52 is a function of the pressures monitored by pressure sensors 56 and 57, and can be determined from the ratio of the pressure measured by sensor 56 on the upstream side of the orifice 52, to the pressure measured by sensor 57 on the downstream side of the orifice 52.

When the conditions are such that the flow of precursor vapor through the orifice 52 is choked flow, the actual flow of precursor vapor through the tube 52 is a function of only the pressure monitored by pressure sensor 57. In either case, the existence of choked or unchoked flow can be determined by the controller 60 by interpreting the process conditions. When the determination is made by the controller 60, the flow rate of precursor gas can be determined by the controller 60 through calculation.

Preferably, accurate determination of the actual flow rate of precursor gas is calculated by retrieving flow rate data from lookup or multiplier tables stored in a non-volatile memory 61 accessible by the controller 60. When the actual flow rate of the precursor vapor is determined, the desired flow rate can be maintained by a closed loop feedback control of one or more of the variable orifice control valve 53, the CVD chamber pressure through evacuation pump 24 or control of reducing or inert gases from sources 26 and 27, or by control of the temperature and vapor pressure of the precursor gas in vessel 31 by control of heaters 44, 45.

As shown in FIG. 1, the solid $TaF_5$, $TaCl_5$ and $TaBr_5$ precursor material 40 is sealed in a cylindrical corrosion resistant metal vessel 31 that maximizes the available surface area of the precursor material. Vapor from either $TaF_5$, $TaCl_5$ or $TaBr_5$ was delivered directly, that is, without the use of a carrier gas, by a high conductance delivery system into a reaction chamber 11. The reaction chamber 11 was heated to a temperature of at least about 100° C. to prevent condensation of vapor or deposition by-products.

The controlled direct delivery of tantalum halide vapor into the reaction chamber 11 was accomplished by heating the solid tantalum halide precursor 40 to a temperature in the range of about 95° C.–205° C., the choice depending upon the particular precursor. The temperature was sufficient to vaporize the precursor 40 to provide a vapor pressure to deliver the tantalum halide vapor to the reaction chamber 11. Thus, a carrier gas was not necessary. A sufficient vapor pressure was greater than about 3 Torr. This pressure was required to maintain a constant pressure drop across a defined orifice in a high conductance delivery system while delivering up to about 50 sccm tantalum halide precursor to a reaction chamber 11 operating in the range of about 0.1–2.0 Torr. The temperatures to obtain the desired pressures were in the range of about 83° C.–95° C. and preferably about 95° C. with $TaF_5$, in the range of about 130° C.–150° C. and preferably about 145° C. with $TaCl_5$, and in the range of about 202° C.–218° C. and preferably about 205° C. with $TaBr_5$. Under these conditions, $TaF_5$ is a liquid while $TaCl_5$ and $TaBr_5$ remain solid.

FIG. 2 shows the relationship between the measured vapor pressure and temperature for the precursors $TaF_5$, $TaCl_5$ and $TaBr_5$, with $TaI_5$ included for comparison. As previously stated, the desired pressure was greater than about 3 Torr and preferably greater than 5 Torr. Also as previously stated, the vapor pressure for $TaF_5$, $TaCl_5$ and $TaBr_5$ was desirably low enough to be able to deposit tantalum in the absence of a carrier gas but yet sufficient to maintain a constant pressure drop across a defined orifice in a high conductance delivery system and still be able to deliver up to 50 sscm $TaX_5$ to a reaction chamber 11 operating at 0.1–2.0 Torr. The vapor pressure for $TaI_5$ was determined to be too low for practical implementation in the described apparatus. For $TaBr_5$ the open circles represent published values, while closed squares for $TaBr_5$, $TaF_5$, $TaCl_5$ and $TaI_5$ represent the inventors' experimental data.

A parallel plate RF discharge was used where the driven electrode was the gas delivery showerhead and the susceptor 22 or stage for the wafer or substrate 23 was the RF ground. The selected $TaX_5$ vapor was combined with other process gases such as $H_2$ above the substrate, which had been heated to a temperature between about 300° C.–500° C. Ar and He could also be used, either singularly or in combination, as process gases in addition to $H_2$.

Process conditions for deposition of good quality PECVD Ta films are given in Table 2, where slm is standard liters per minute and W/cm$^2$ is watts per centimeter squared.

TABLE 2

| | |
|---|---|
| Substrate Temperature | 300° C.–500° C. |
| $TaX_5$ temperature | 95° C. ($TaF_5$), 145° C. ($TaCl_5$), 205° C. ($TaBr_5$) |
| $TaX_5$ flow | 1–50 sccm |
| $H_2$ flow | 1–10 slm |
| Ar, He flow | 0–10 slm |
| Process Pressure | 0.2–5.0 Torr |
| RF Power | 0.1–5.0 W/cm$^2$ |

The $TaF_5$, $TaCl_5$ and $TaBr_5$ based PECVD Ta film properties for process conditions using the method of the invention are given in Table 3. Representative values were selected from among PECVD of Ta from a $TaX_5$ precursor ($TaF_5$ number of experiments (n)=15, $TaCl_5$ n=8, $TaBr_5$ n=8) on 200 mm Si and $SiO_2$ substrates.

TABLE 3

| Film | Precursor | $TaX_5$ flow (sccm) | $H_2$ flow (slm) | Pressure (Torr) | Temp. (° C.) | RF (Watts) | Dep. rate (Å/min.) | Resistivity ($\mu\Omega$cm) | Step Coverage | Halogen conc. (atomic %) |
|---|---|---|---|---|---|---|---|---|---|---|
| Ta | $TaF_5$ | 14 | 7 | 1 | 375 | 200 | 150 | 49 | 0.4 | <2 |
| Ta | $TaF_5$ | 14 | 7 | 1 | 440 | 100 | 125 | 530 | 0.5 | <2 |
| Ta | $TaCl_5$ | 14 | 7 | 1 | 350 | 200 | 400 | 560 | 0.24 | <2 |
| Ta | $TaCl_5$ | 14 | 7 | 1 | 400 | 200 | 220 | 220 | n/a | <2 |
| Ta | $TaBr_5$ | 5 | 7 | 1 | 375 | 100 | 100 | 600 | 0.5 | <2 |
| Ta | $TaBr_5$ | 5 | 7 | 1 | 430 | 100 | 115 | 464 | 0.58 | <2 |

Process conditions for deposition of good quality PECVD $TaN_x$ films are given in Table 4.

TABLE 4

| | |
|---|---|
| Substrate Temperature | 300° C.–500° C. |
| $TaX_5$ temperature | 95° C. ($TaF_5$), 145° C. ($TaCl_5$), 205° C. ($TaBr_5$) |
| $TaX_5$ flow | 1–50 sccm |
| $H_2$ flow | 1–10 slm |
| $N_2$ flow | 0.1–10 slm |
| Ar, He flow | 0–10 slm |
| Process Pressure | 0.2–5.0 Torr |
| RF Power | 0.1–5.0 W/cm$^2$ |

The $TaF_5$, $TaCl_5$ and $TaBr_5$ based PECVD $TaN_x$ film properties for process conditions using the method of the invention are given in Table 5. Representative values were selected from among PECVD of $TaN_x$ from a $TaX_5$ precursor ($TaF_5$ number of experiments (n)=15, $TaCl_5$ n=8, $TaBr_5$ n=8) on 200 mm Si and $SiO_2$ substrates.

TABLE 5

| Film | Precursor | TaX$_5$ flow (sccm) | N$_2$ flow (slm) | H$_2$ flow (slm) | Pressure (Torr) | Temp. (° C.) | RF (Watts) | Dep. rate (Å/min.) | Resistivity ($\mu\Omega$cm) | Step Coverage |
|---|---|---|---|---|---|---|---|---|---|---|
| TaN | TaF$_5$ | 14 | 0.5 | 7 | 1.1 | 430 | 200 | 305 | 505 | 0.2 |
| TaN | TaF$_5$ | 14 | 2.5 | 7 | 1.4 | 400 | 200 | 755 | 1120 | 0.2 |
| TaN | TaF$_5$ | 14 | 5 | 5 | 1.6 | 400 | 200 | 1900 | 2160 | 0.2 |
| TaN | TaCl$_5$ | 14 | 0.5 | 7 | 1.1 | 350 | 200 | 525 | 945 | 0.2 |
| TaN | TaCl$_5$ | 14 | 2.5 | 7 | 1.4 | 400 | 500 | 613 | 1564 | 0.25 |
| TaN | TaCl$_5$ | 14 | 5 | 5 | 1.6 | 400 | 500 | 953 | 7865 | 0.13 |
| TaN | TaBr$_5$ | 2.5 | 0.5 | 7 | 1.1 | 375 | 100 | 107 | 1177 | 0.5 |
| TaN | TaBr$_5$ | 2.5 | 1.5 | 7 | 1.3 | 375 | 100 | 200 | 2300 | 0.2 |

Process conditions for deposition of good quality thermal CVD TaN$_x$ films are given in Table 6.

TABLE 6

| | |
|---|---|
| Substrate Temperature | 300° C.–500° C. |
| TaX$_5$ temperature | 95° C. (TaF$_5$), 145° C. (TaCl$_5$), 205° C. (TaBr$_5$) |
| TaX$_5$ flow | 1–50 sccm |
| H$_2$ flow | 0–10 slm |
| Ar, He flow | 0–10 slm |
| Process Pressure | 0.2–5.0 Torr |
| NH$_3$ flow | 0.1–10 slm |
| N$_2$ flow | 0–10 slm |

The TaF$_5$ and TaBr$_5$ based thermal CVD TaN$_x$ film properties for process conditions using the method of the invention are given in Table 7. Representative values were selected from among the depositions of TaN$_x$ from a TaX$_5$ precursor (TaF$_5$ n=10, TaBr$_5$ n=22) on 200 mm silicon (Si) and silicon dioxide (SiO$_2$) substrates. In addition, Ta/TaN$_x$ bilayers were also deposited (TaF$_5$ n=3, TaBr$_5$ n=1). The properties of the deposited tantalum films as listed in Table 7 were uniform within plus or minus 20% across the wafer.

The integrated films deposited by the method of the invention display characteristics important to the formation of an IC. There is a good smooth interface and good adhesion between the Ta and TaN$_x$ layers. The film is in the range of low enough electrical resistivity for low interconnect impedances (less than 1000 $\mu\Omega$cm and preferably less than 500 $\mu\Omega$cm), and the film has good conformality and good step coverage (greater than 0.3). In addition, the level of impurities are low (less than 2 atomic percent). Also, the deposition rates are sufficient for throughput considerations (greater than 100 Å/min) and the process uses a low wafer temperature (less than 450° C.) and thus is compatible with other thin film materials used within the device including materials with dielectric constants lower than that of SiO$_2$.

The dependence of the film resistivities on the deposition temperature differed among the three precursors. For Ta/TaN$_x$ integrated films deposited by PECVD Ta and PECVD TaN$_x$ films using TaF$_5$ precursors, at a temperature of 430° C. and at a N$_2$ flow of 0.5 slm, the film had a resistivity of about 115 $\mu\Omega$cm. At a temperature of 350° C. and a N$_2$ flow of 0.5 slm, the film resistivity decreased to 85 $\mu\Omega$cm. When the N$_2$ flow rate was increased to 2.5 slm with

TABLE 7

| Film | Precursor | TaX$_5$ flow (sccm) | NH$_3$ flow (slm) | Pressure (Torr) | Temp. (° C.) | Deposition Rate (Å/min) | Resistivity ($\mu\Omega$cm) | Step Coverage | Halogen conc. (atomic %) |
|---|---|---|---|---|---|---|---|---|---|
| TaN | TaF$_5$ | 6 | 1 | 0.3 | 415 | 850 | >1 × 10$^7$ | 0.2 | <2 |
| TaN | TaF$_5$ | 10 | 1 | 0.3 | 415 | 1000 | 7 × 10$^6$ | 1 | <2 |
| TaN | TaF$_5$ | 28 | 1 | 0.3 | 415 | 1115 | 4 × 10$^5$ | 1 | <2 |
| TaN | TaBr$_5$ | 10 | 1 | 1 | 425 | 200 | >1 × 10$^7$ | 0.6 | <2 |

The TaF$_5$, TaCl$_5$ and TaBr$_5$ based Ta/TaN$_x$ bilayer film properties for process conditions using the method of the invention are given in Table 8. All films were PECVD Ta and PECVD TaN$_x$.

a temperature of 400° C., the resistivity increased to 211 $\mu\Omega$cm. For Ta/TaN$_x$ films using TaCl$_5$ as the precursor, at a temperature of 400° C. a N$_2$ flow rate of 2.5 slm, the resistivity was 1995 $\mu\Omega$cm. For Ta/TaN$_x$ films deposited

TABLE 8

| Precursor | TaX$_5$ flow (sccm) | N$_2$ flow (slm) | H$_2$ flow (slm) | Pressure (Torr) | Temp. (° C.) | RF (Watts) | Deposition Rate (Å/min) | Resistivity ($\mu\Omega$cm) | Step Coverage |
|---|---|---|---|---|---|---|---|---|---|
| TaF$_5$ | 14 | | 7 | 1 | 430 | 200 | 153 | 115 | 0.5 |
| | 14 | .05 | 7 | 1.1 | 430 | 200 | | | |
| TaF$_5$ | 14 | | 7 | 1 | 350 | 200 | 190 | 85 | |
| | 14 | 0.5 | 7 | 1.1 | 350 | 200 | | | |
| TaF$_5$ | 14 | | 7 | 1 | 400 | 200 | 264 | 211 | 0.19 |
| | 14 | 2.5 | 7 | 1.4 | 400 | 200 | | | |
| TaCl$_5$ | 14 | | 7 | 1 | 400 | 200 | 578 | 1995 | 0.19 |
| | 14 | 2.5 | 7 | 1.4 | 400 | 200 | | | |
| TaBr$_5$ | 5 | | 7 | 1 | 430 | 100 | 162 | 645 | 0.37 |
| | 5 | 0.5 | 7 | 1.1 | 430 | 100 | | | | using TaBr$_5$ as the precursor, at a temperature of 430° C. and a N$_2$ flow of 0.5 slm, the resistivity was 645 $\mu\Omega$cm. Thus, for all three precursors, the resistivity of the Ta/TaN$_x$ film was high when the N$_2$ flow in the gas mix was increased. The increased resistivity is assumed to be due to the increase of nitrogen concentration in the film. This is consistent with previous results from Ta/TaN$_x$ films deposited either by PVD methods such as sputtering, or by organic-metal CVD (OMCVD), where increasing the ratio of nitrogen to tantalum dramatically increased the resistivity of the Ta/TaN$_x$ film.

Figure 3:
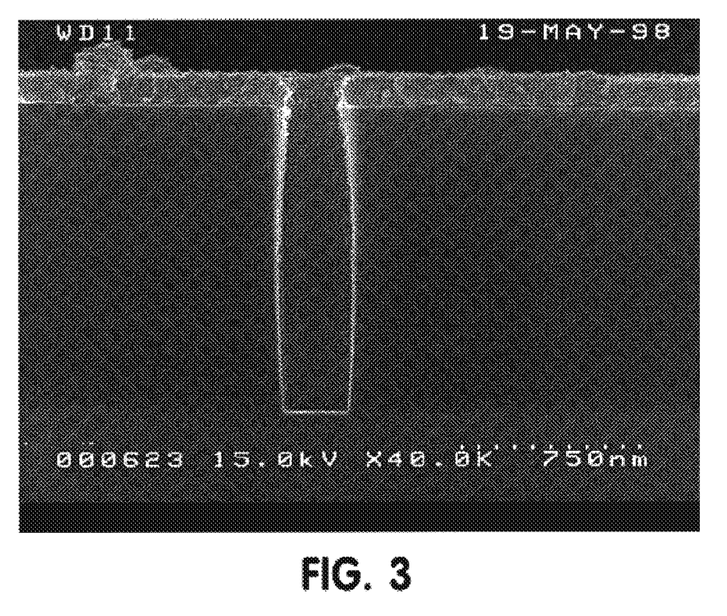
FIG. 3 is a photograph of a scanning electron micrograph (SEM) of a tantalum nitride (TaN$_x$) film using a tantalum pentafluoride (TaF$_5$) precursor.
Figure 4:
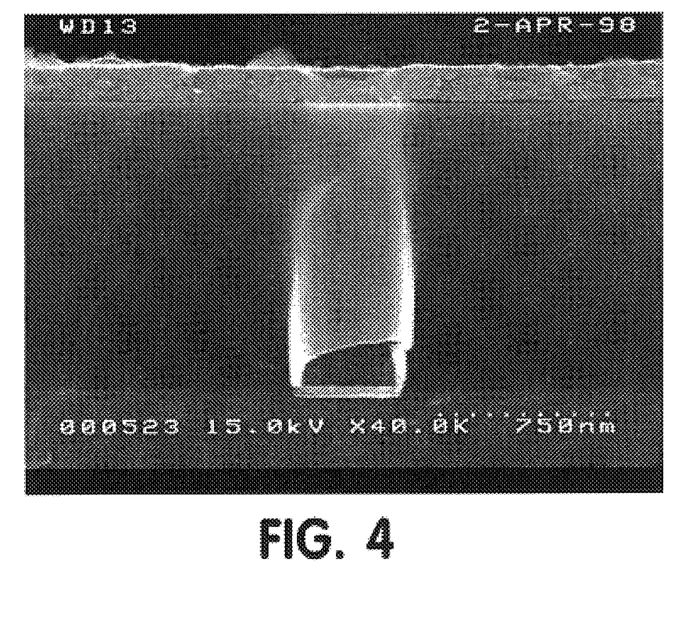
FIG. 4 is a photograph of a SEM of a TaN$_x$ film using a tantalum pentachloride (TaCl$_5$) precursor.

Scanning electron micrographs (SEM) of Ta/TaN$_x$ bilayer films deposited by PECVD according to the invention were obtained and are shown in FIG. 3 and FIG. 4. FIG. 3 is a SEM of a Ta/TaN$_x$ bilayer film using TaF$_5$ as the precursor, and FIG. 4 is a SEM of a Ta/TaN$_x$ bilayer film using TaBr$_5$ as the precursor. The TaBr$_5$ based PECVD Ta/TaN$_x$ bilayer films appear to have better step coverage than the TaF$_5$Ta/TaN$_x$ films. It is hypothesized that TaCl$_5$ based PECVD Ta/TaN$_x$ bilayer films would also have better step coverage than the TaF$_5$ Ta/TaN$_x$ films.

FIG. 3 and FIG. 4 show a substrate containing a feature with an aspect ratio structure with representative bottom step coverage and side wall coverage for each of the precursors. The step coverage represents the film thickness on the bottom of the feature divided by the film thickness on the surface of the substrate adjacent the feature, also called the field. An ideal step coverage is 1.0 or 100%, representing identical thickness on the bottom as on the field. The TaBr$_5$ and TaCl$_5$ based PECVD Ta/TaN$_x$ films generally appeared to be smoother than the TaF$_5$ based PECVD Ta/TaN$_x$ film, which appeared the roughest. As shown in Table 8, for TaBr$_5$ the step coverage was 0.37, for TaCl$_5$ the step coverage was 0.19 and for TaF$_5$ the step coverage in two integrated films was 0.5 and 0.19.

The compatibility of the Ta/TaN$_x$ film process of the present invention with copper was determined. Since in practice the Ta/TaN$_x$ film will be integral, that is, in direct contact with copper, little or no attack or etching of the copper should take place during Ta/TaN$_x$ deposition. Ta/TaN$_x$ compatibility with copper was tested by placing a Si wafer containing a 500 Å layer of TiN$_x$ deposited by PVD and a 2000 Å layer of copper deposited by PVD into the reaction chamber 11. A TaN$_x$ film was deposited by PECVD on top of the copper layer using the process of the invention with either a TaF$_5$ or TaCl$_5$ precursor.

Figure 5:
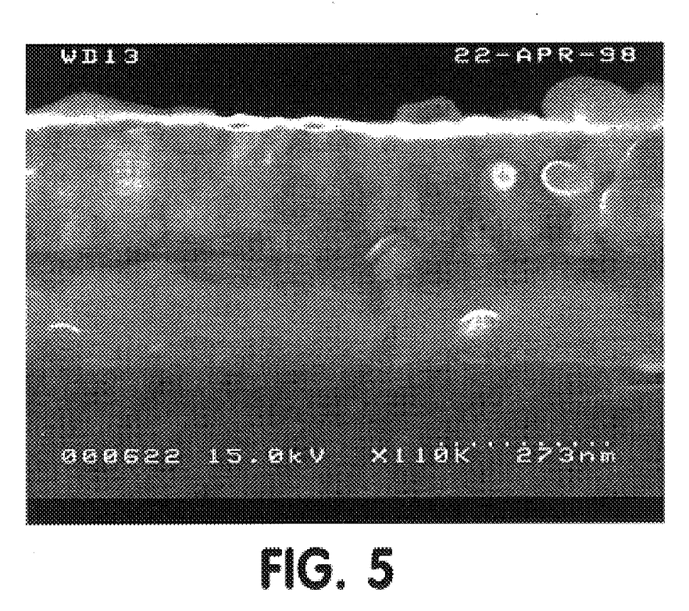
FIG. 5 is a photograph of a SEM of a TaN$_x$ film using a tantalum pentafluoride (TaF$_5$) precursor.
Figure 6:
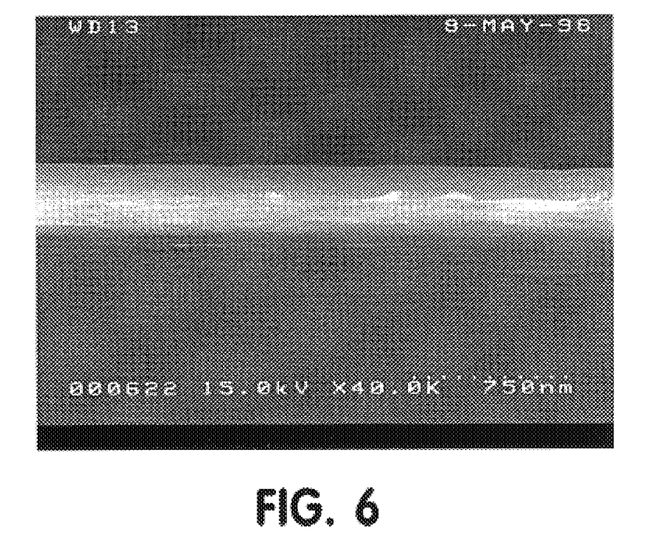
FIG. 6 is a photograph of a SEM of a TaCl$_5$ based film stack.
Figure 7:
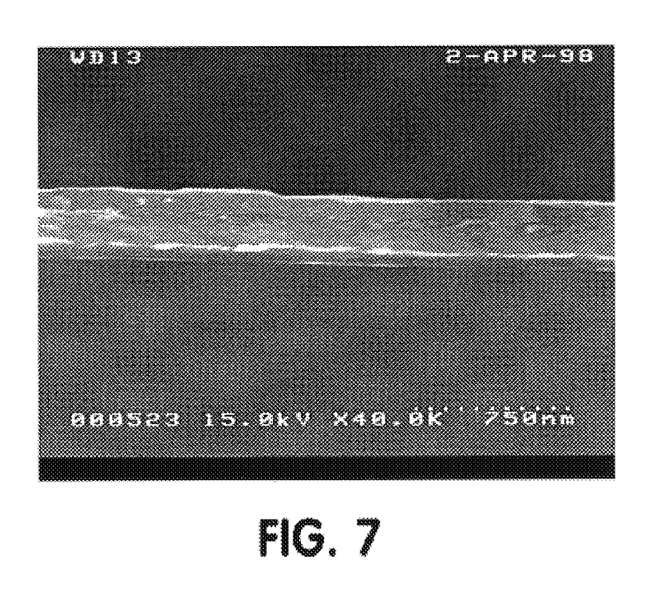
FIG. 7 is a photograph of a SEM of a TaBr$_5$ based film stack.

Photographs of SEM images of the resulting films are shown in FIGS. 5–7. FIG. 5 shows a TaF$_5$ based PECVD Ta/TaN$_x$ bilayer on a Cu film deposited by PVD. FIG. 6 shows a TaCl$_5$ based PECVD Ta/TaN$_x$ bilayer on a Cu film deposited by PVD. FIG. 7 shows a TaBr$_5$ based PECVD Ta/TaN$_x$ bilayer on a Cu film deposited by PVD. The Cu layers have the same thicknesses of about 2000 Å as they were deposited and in combination with the clean interface with the PECVD Ta/TaN$_x$. FIGS. 5–7 also indicate a clean and smooth interface between the Cu layer and the PECVD Ta/TaN$_x$ bilayer. It can therefore be concluded that very little or no attack or etching occurs during PECVD of either TaF$_5$, TaCl$_5$ or TaBr$_5$ precursor-based PECVD Ta/TaN$_x$ films.

Figure 8:
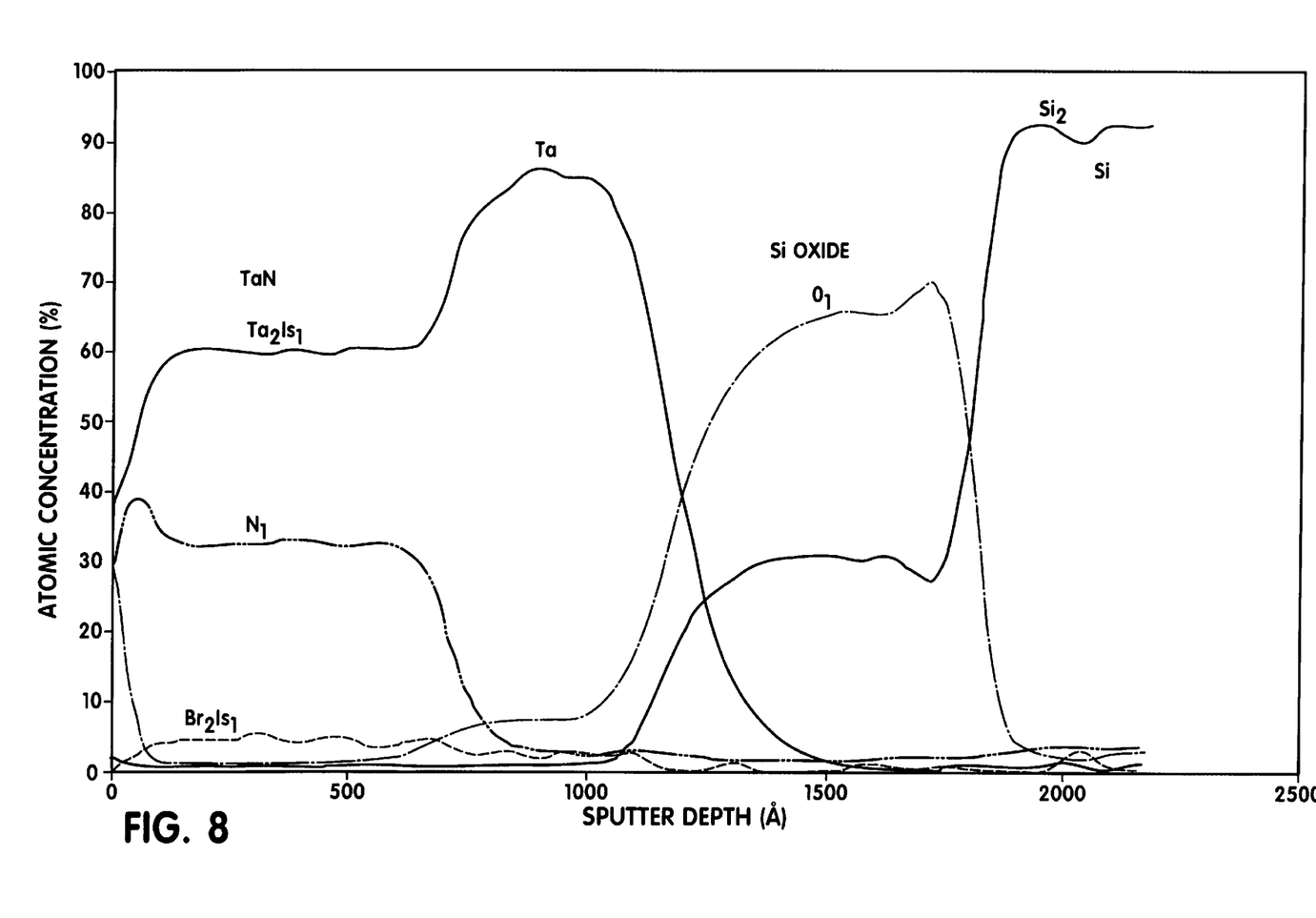
FIG. 8 is an Auger spectrum tracing of a TaN$_5$ film using a TaBr$_5$ precursor deposited on SiO$_2$.
Figure 9:
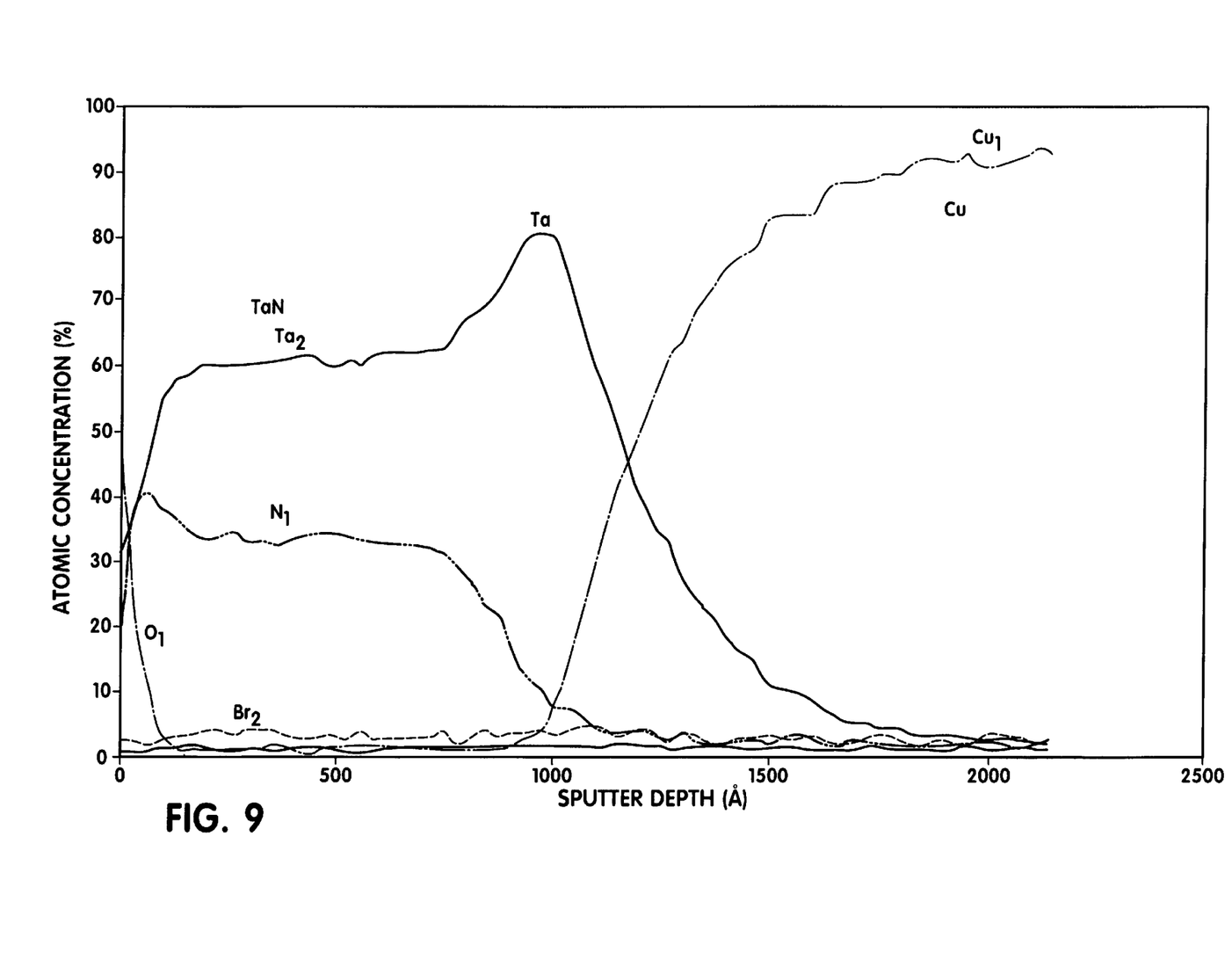
FIG. 9 is an Auger spectrum tracing of a TaN$_x$ film using a TaBr$_5$ precursor deposited on a PECVD tantalum film.

Selected films were also evaluated by Auger electron spectroscopy and the results are shown in FIGS. 8–9. An Auger analysis spectrum with TaBr$_5$ used as the precursor for depositing Ta/TaN$_x$ on a SiO$_2$ layer is shown in FIG. 8. An Auger analysis spectrum with TaBr$_5$ used as the precursor for depositing Ta/TaN$_x$ on the abovementioned Cu layer deposited by PVD is shown in FIG. 9. Analysis of the Auger spectra confirmed the clean interface between the TaN$_x$ and other layers. The analysis also confirmed the low level of impurities present in the films. The figures indicate that the PECVD TaN$_x$ films were nitrogen poor (x<1.0), which is consistent with the results shown in Table 2. These films were deposited with the low N$_2$:H$_2$ ratio of 0.5:7, which was expected to result in a lower nitrogen-containing film. The normally exponentially rising electrical resistivity of TaN$_x$ when x>1.0 is observed in TaN$_x$ films deposited by both PVD and CVD. The figures show relatively sharp interfaces between all layers, which indicated very little Cu diffusion into the bilayer. The bromide concentration was determined to be less than 2 atomic percent.

Therefore, a method of producing high quality PECVD Ta/TaN$_x$ bilayer films suitable for integration with IC interconnect elements that contain copper has been demonstrated. The method is based on the vapor delivery of either TaF$_5$, TaCl$_5$ or TaBr$_5$ precursors. All of the resulting Ta/TaN$_x$ films from the three precursors demonstrated reasonable step coverage, low residual impurity concentrations, sufficiently high deposition rates and no signs of TaN$_x$ etching of copper.

It should be understood that the embodiments of the present invention shown and described in the specification are only preferred embodiments of the inventors who are skilled in the art and are not limiting in any way. For example, Ta films may be deposited by PECVD, and TaN$_x$ films may be deposited by thermal CVD, plasma treated thermal CVD, and PECVD as disclosed in, respectively, PECVD OF Ta FILMS FROM TANTALUM HALIDE PRECURSORS (Ser. No. 09/300,583), THERMAL CVD OF TaN FILMS FROM TANTALUM HALIDE PRECURSORS (Ser. No. 09/300,661), PLASMA TREATED THERMAL CVD) OF TaN FILMS FROM TANTALUM HALIDE PRECURSORS (U.S. Pat. No. 6,268,288), and PECVD OF TaN FILMS FROM TANTALUM HALIDE PRECURSORS (U.S. Pat. No. 6,265,311), all of which are invented by Hautala and Westendorp and assigned to Tokyo Electron Limited, are copending applications filed on the same date as the present application and which are expressly incorporated by reference herein in their entirety. Furthermore, TaN$_x$ may be used for plug fill according to the invention as disclosed in CVD TaN$_x$ PLUG FORMATION FROM TANTALUM HALIDE PRECURSORS (Ser. No. 09/300,647, now abandoned), invented by Hautala and Westendorp and assigned to Tokyo Electron Limited, which is a copending applications filed on the same date as the present application and which is expressly incorporated by reference herein in its entirety. Therefore, various changes, modifications or alterations to these embodiments may be made or resorted to without departing from the spirit of the invention and the scope of the following claims.

What is claimed is:

1. A method of depositing a tantalum (Ta) barrier film and a tantalum nitride (TaN$_x$) barrier film on a semiconductor device substrate having a temperature in the range of about 300° C.–500° C., the method comprising depositing said Ta film by a plasma enhanced CVD process including providing a vapor of a tantalum pentachloride precursor to a reaction chamber containing said substrate by heating said precursor to a temperature sufficient to vaporize said precursor and combining said vapor in said reaction chamber with a process gas consisting essentially of hydrogen and optionally one or more of argon and helium, and generating a plasma in said combined vapor and process gas and reacting said combined vapor and process gas in the presence of said plasma to deposit said Ta, and depositing said TaN$_x$ film by a CVD process selected from the group consisting of: (a) thermal CVD including combining said vapor above said substrate with a process gas consisting essentially of nitrogen and hydrogen and optionally one or more of argon and helium by providing said process gas to said reaction chamber concurrently with providing said vapor to said reaction chamber to deposit said $TaN_x$, and (b) plasma enhanced CVD including combining said vapor above said substrate with a process gas consisting essentially of $N_2$ and $H_2$ and optional inert gases to deposit said $TaN_x$ wherein the deposit Ta and $TaN_x$ films each contain less than 2 atomic percent chlorine.

2. The method of claim 1 wherein said heating of said precursor is to a temperature of about 145° C.

3. The method of claim 1 wherein said heating of said precursor is to a temperature sufficient to provide a vapor pressure of said precursor of at least 3 Torr.

4. The method of claim 1 wherein said delivery of said precursor is in the range of about 1–50 sccm.

5. The method of claim 1 wherein said process gas to deposit said Ta is hydrogen gas at a flow in the range of about 1–10 slm.

6. The method of claim 1 wherein said process gas to deposit said $TaN_x$ is at a flow up to about 10 slm.

7. The method of claim 1 wherein said depositing occurs at a pressure of said chamber in the range of about 0.2–5.0 Torr.

8. The method of claim 1 wherein said film is integral with a copper layer of said substrate.

9. The method of claim 1 wherein said depositing occurs at a rate of at least about 100 Å/min.

10. The method of claim 1 wherein said substrate comprises an integrated circuit containing a high aspect ratio feature.

11. The method of claim 1 wherein said precursor is delivered to said reaction chamber without a carrier gas.

12. The method of claim 1 wherein said Ta film is deposited on said $TaN_x$ film.

13. The method of claim 1 wherein said $TaN_x$ film is deposited on said Ta film.

14. The method of claim 1 wherein at least the following films are deposited: a first Ta film is deposited on a substrate, a first $TaN_x$ film is deposited on said first Ta film, a second Ta film is deposited on said first $TaN_x$ film, and a second $TaN_x$ film is deposited on second Ta film.

15. The method of claim 1 wherein at least the following films are deposited: a first $TaN_x$ film is deposited on a substrate, a first Ta film is deposited on said first $TaN_x$ film, a second $TaN_x$ film is deposited on said first Ta film, and a second Ta film is deposited on second $TaN_x$ film.

16. The method of claim 1 wherein a plurality of Ta and $TaN_x$ film layers are deposited.

17. A method of depositing a Ta/$TaN_x$ bilayer barrier film on a semiconductor device substrate having a temperature in the range of about 300° C.–500° C., the method comprising delivering a tantalum pentachloride precursor to a reaction chamber containing said substrate without a carrier gas by elevating a temperature of said precursor sufficient to produce a vapor of said precursor to provide a pressure of at least about 3 Torr to deliver said vapor of said precursor, depositing said Ta film by plasma enhanced CVD by combining said vapor in said reaction chamber with a first process gas consisting essentially of hydrogen and argon, and generating a plasma in said combined vapor and first process gas and reacting said combined vapor and first process gas in the presence of said plasma, and then depositing said $TaN_x$ film by a CVD process selected from the group consisting of: (a) thermal CVD by combining said vapor above said substrate with a second process gas consisting essentially of hydrogen and nitrogen by providing said second process gas to said reaction chamber concurrently with providing said vapor to said reaction chamber and (b) plasma enhanced CVD by combining said vapor above said substrate with a third process gas consisting essentially of $N_2$ and $H_2$ wherein the deposited Ta and $TaN_x$ films each contain less than 2 atomic percent chlorine.

18. The method of claim 17 wherein said elevated temperature is less than a temperature that would cause a reaction between said precursor vapor and said first and second and third process gas.

19. The method of claim 17 wherein said elevated temperature is about 145° C.

20. The method of claim 17 wherein said elevated temperature is in the range of about 130° C. to about 150° C.

* * * * *

UNITED STATES PATENT AND TRADEMARK OFFICE
CERTIFICATE OF CORRECTION

PATENT NO. : 6,410,432 B1
DATED : June 25, 2002
INVENTOR(S) : John J. Hautala, and Johannes F. M. Westendorp It is certified that error appears in the above-identified patent and that said Letters Patent is hereby corrected as shown below:

<u>Title page, Item [54] and Column 1, line 1</u>
Reads "INTEGRATED TA AND TAN$_x$" and should read -- INTEGRATED Ta AND TaN$_x$ --.

<u>Column 3,</u>
Line 30, reads "tracing of a TAN$_5$ film" and should read -- tracing of a TaN$_x$ film --.
Line 49, reads "pentaiodide (TaI$_5$)" and should read -- pentaiodide (TaI$_5$) --.
Table 1, Line 60 reads "TaI$_5$" and should read -- TaI$_5$ --.

<u>Column 4,</u>
Line 11, reads "nitride (TaN$_x$) The" and should read -- nitride (TaN$_x$). The --.
Line 13, reads "since TaN can be" and should read -- since TaN$_x$ can be --.
Line 61, reads "TiI$_4$" and should read -- TiI$_4$ --.
Line 67, reads "may be used,to seal" and should read -- may be used to seal --.

<u>Column 5,</u>
Line 5, reads "(Tax$_5$)" and should read -- (TaX$_5$) --.
Line 53, reads "TaI$_5$" and should read -- TaI$_5$ --.
Line 61, reads "TiI$_4$" and should read -- TiI$_4$ --.

<u>Column 7,</u>
Line 58, reads "TaI$_5$" and should read -- TaI$_5$ --.

<u>Column 8,</u>
Lines 2 and 6, reads "TaI$_5$" and should read -- TaI$_5$ --.

UNITED STATES PATENT AND TRADEMARK OFFICE
CERTIFICATE OF CORRECTION

PATENT NO. : 6,410,432 B1
DATED : June 25, 2002
INVENTOR(S) : John J. Hautala, and Johannes F. M. Westendorp It is certified that error appears in the above-identified patent and that said Letters Patent is hereby corrected as shown below:

Column 12,
Line 32, reads "THERMAL CVD) OF" and should read -- THERMAL CVD OF --.

Column 13,
Line 9, reads "wherein the deposit Ta and $TaN_x$ films" and should read --wherein the deposited Ta and $TaN_x$ films --.

Signed and Sealed this

Eighteenth Day of February, 2003

JAMES E. ROGAN
*Director of the United States Patent and Trademark Office*